United States Patent [19]

Ogawa et al.

[11] Patent Number: 5,306,671
[45] Date of Patent: Apr. 26, 1994

[54] METHOD OF TREATING SEMICONDUCTOR SUBSTRATE SURFACE AND METHOD OF MANUFACTURING SEMICONDUCTOR DEVICE INCLUDING SUCH TREATING METHOD

[75] Inventors: Toshiaki Ogawa; Hiroshi Morita; Tomoaki Ishida; Kenji Kawai; Moriaki Akazawa, all of Hyogo, Japan

[73] Assignee: Mitsubishi Denki Kabushiki Kaisha, Tokyo, Japan

[21] Appl. No.: 718,674

[22] Filed: Jun. 21, 1991

[30] Foreign Application Priority Data

Jul. 9, 1990 [JP] Japan .................................. 2-183751
May 1, 1991 [JP] Japan .................................. 3-99365

[51] Int. Cl.$^5$ ...................... H01L 21/00; H01L 21/02
[52] U.S. Cl. .................................. 437/225; 437/228; 156/643; 156/646
[58] Field of Search ................ 437/225, 228; 156/643, 156/646, 662

[56] References Cited

U.S. PATENT DOCUMENTS 4,886,765 12/1989 Chen et al.

OTHER PUBLICATIONS

Ruzyllo, Removal of organic contaminants from silicon surface after reactive ion etching, Chemical Abstracts, 1987, CA 108(4):30321w.
Ikawa, Si Surface Treatment Using Deep UV Irradiation, Dry Process Symposium, 1985, pp. 25–29.
T. Akimoto et al., "Removal of RIE Induced Damage Layer Using NF3/02 Chemical Dry Etching".
Japan 2-148726, Patent Abstracts of Japan, E-969, vol. 14, No. 394 (Aug. 24, 1990).
Japan 2-63118, Patent Abstracts of Japan, E-929, vol. 14, No. 234 (May 17, 1990).
Cerva et al, "Transmission Electron Microscope Study of Lattice Damage and Polymer Coating Formed After Reactive Ion Etching of SiO$_2$", *J. Vac. Sci. Technol. B.*, vol. 5, No. 2 (1987), pp. 590–593.
"Rie Damage Removal in a Downstream Plasma Reactor", *IBM Technical Disclosure Bulletin*, vol. 32, No. 6A (Nov. 1989), pp. 362–363.
Nagata et al, "Downstream Etching of Si and SiO Employing CF /O or NF /O at High Temperature", *Japanese Journal of Applied Physics*, vol. 28, No. 11 (Nov. 1989), 4 pages 2368-2371.
H. R. Potts, "Plasma Corrosion Inhibition", *IBM Technical Disclosure Bulletin*, vol. 24, No. 11B (Apr. 1982), p. 6001.
Sellamuthu et al, "Study of Anisotropic Trench Etching of Si with NF$_3$-Halocarbon", *J. Vac. Sci. Technol. B.*, 5(1) (1987), pp. 342–346.
Faith et al, "Comparative Investigation of CF-Plasma, Ar-Plasma, and Dilute-HF-Dip Cleaning Methods for (Al-Si)/n Si Contacts", *J. Electrochem. Soc.:4Solid-State Science and Technology*, vol. 134, No. 3 (Mar. 1987), pp. 665–668.

*Primary Examiner*—Brian E. Hearn
*Assistant Examiner*—B. Everhart
*Attorney, Agent, or Firm*—Lowe, Price, LeBlanc & Becker

[57] ABSTRACT

A principal feature of the present invention is to clean a surface of a semiconductor substrate without providing a damaged layer to the surface thereof. A native oxide film formed on the surface of a silicon substrate is etched by plasma employing a gas containing fluorine. The surface of the semiconductor substrate is again subjected to plasma etching by employing a gas containing fluorine in order to remove a surface damaged layer and a fluorocarbon layer formed in the above step of plasma etching. The semiconductor substrate surface is irradiated with ultraviolet rays under a low pressure in order to dissociate and remove fluorine atoms chemically adsorbed to the semiconductor substrate surface upon the latter plasma etching.

12 Claims, 8 Drawing Sheets

METHOD OF TREATING SEMICONDUCTOR SUBSTRATE SURFACE AND METHOD OF MANUFACTURING SEMICONDUCTOR DEVICE INCLUDING SUCH TREATING METHOD

BACKGROUND OF THE INVENTION

1. Field of the Invention

The present invention relates generally to a method of treating a surface of a semiconductor substrate and, more particularly, to a method of cleaning the surface of the semiconductor substrate without a damaged layer left in the surface thereof. The invention further relates to a method of manufacturing a semiconductor device including such a method of treating the semiconductor substrate surface.

2. Description of the Background Art

A surface of a semiconductor substrate, e.g., a silicon substrate must be cleaned in order to manufacture a highly reliable semiconductor device.

FIGS. 7A–7D are cross-sectional views showing a conventional treating method of a semiconductor substrate surface. (See 1985 Dry Process Symposium.)

Figure 7A:
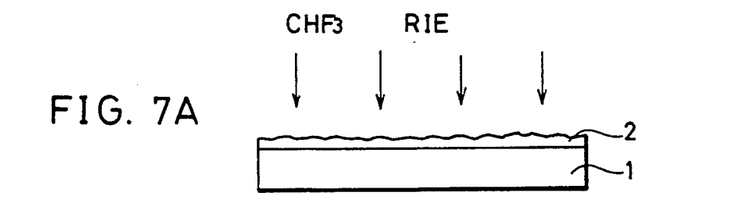
FIGS. 7A-7D are cross-sectional views showing conventional process steps for treating a semiconductor substrate surface.
Figure 7B:
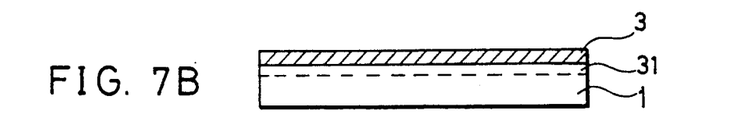

Referring to FIG. 7A, a native oxide film 2 is usually formed on a surface of a silicon substrate 1. This native oxide film 2 is removed by a reactive ion etching employing a $CHF_3$ gas. At this time, with reference to FIG. 7B, a fluorocarbon layer (a polymer layer of $CF_x$) 3 is formed on the surface of silicon substrate 1. Since the surface of silicon substrate 1 is subjected to plasma irradiation, a surface damaged layer 31 is formed in the surface of silicon substrate 1.

Figure 7C:
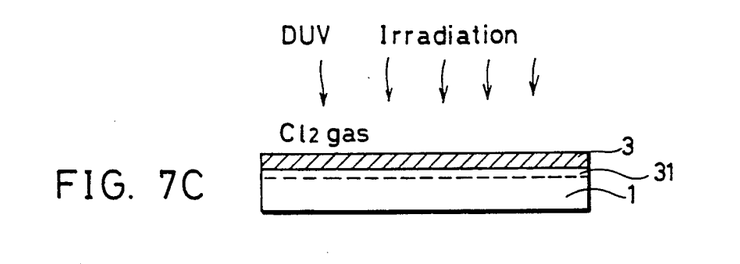

Referring to FIG. 7C, the surface of silicon substrate 1 is irradiated with ultraviolet rays in a $Cl_2$ gas atmosphere in order to remove fluorocarbon layer 3. Thus, with reference to FIG. 7D, fluorocarbon layer 3 adhering to the surface of silicon substrate 1 is removed.

Figure 7D:
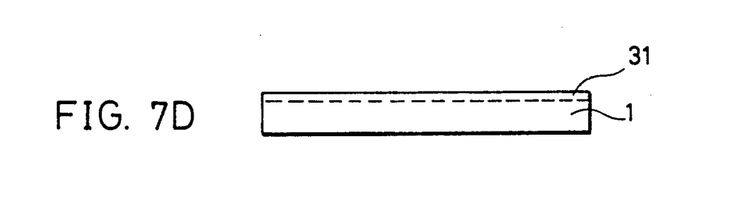

In this method, however, although fluorocarbon layer 3 can be removed without native oxide film 2 left, there is a disadvantage that surface damaged layer 31 formed in the surface of silicon substrate 1 cannot be removed.

FIGS. 8A–8D are cross-sectional views showing another conventional example of a treating method of a semiconductor substrate surface.

Figure 8A:
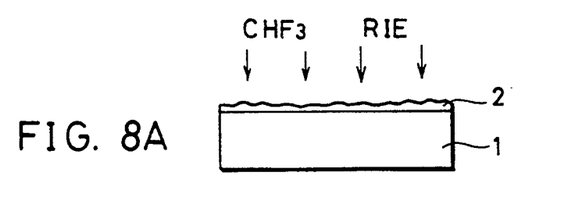
FIGS. 8A-8D are cross-sectional views showing another conventional example of process steps for treating a semiconductor substrate surface.

Referring to FIG. 8A, a native oxide film 2 formed on the surface of a silicon substrate 1 is removed by a reactive ion etching employing a $CHF_3$ gas or a mixed gas of $C_mF_n$, $H_2$ and the like.

Figure 8B:
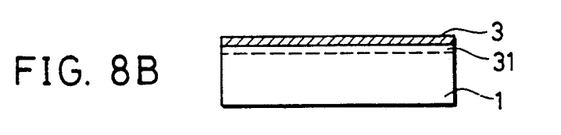
Figure 8C:
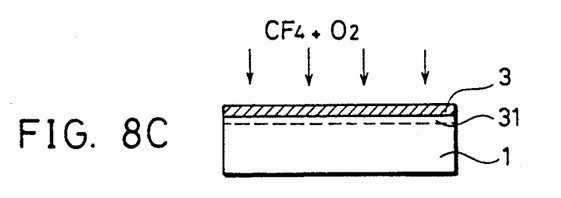
Figure 8D:
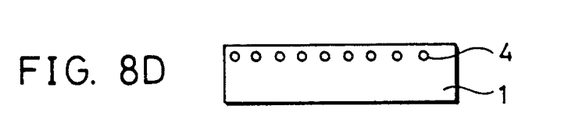

At this time, with reference to FIG. 8B, a fluorocarbon layer (a polymer layer of $CF_x$) 3 is formed on the surface of silicon substrate 1. Since the surface of silicon substrate 1 is subjected to plasma irradiation, a surface damaged layer 31 is formed in the surface of silicon substrate 1. Referring to FIGS. 8C and 8D, the surface of silicon substrate 1 is lightly etched by afterglow discharge employing a mixed gas of $CF_4$ and $O_2$ in order to remove fluorocarbon layer 3 and surface damaged layer 31. Conventionally, the surface of the silicon substrate is treated by this method, thereby decreasing an electric resistance of the substrate.

In addition, the foregoing method is applied not only to the step of removing native oxide film 2 but also to a single step for manufacturing a transistor, i.e., the step of selectively etching a silicon oxide film covering the surface of the substrate in order to form sidewall spacers on sidewalls of a gate.

However, with reference to FIG. 8D, the surface treatment method of the above-described latter conventional example has a disadvantage that fluorine remains in the form of an $SiF_x$ layer 4 in the surface of silicon substrate 1.

Figure 9A:
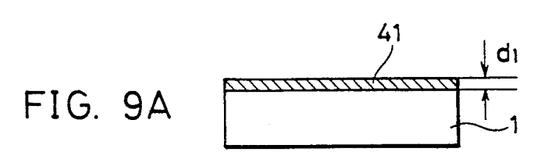
FIGS. 9A and 9B are views showing a problem provided when an $SiF_x$ layer is formed on a surface of a semiconductor substrate.
Figure 9B:
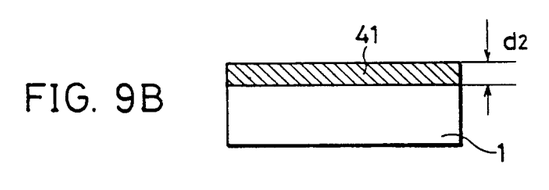

If such an $SiF_x$ layer 4 exists in the surface of silicon substrate 1, the following problems arise. More specifically, with reference to FIG. 9A, there is a problem that fluorine causes abnormal acceleration of an oxidation reaction in the step of forming a gate oxide film 41 for forming, for example, a transistor, on a silicon substrate 1. That is, when gate oxide film 41 having a film thickness d shown in FIG. 9A is formed on silicon substrate 1, there is a problem that a gate oxide film 41 having an extremely large film thickness $d_2$ ($d_2 > d_1$) is obtained as shown in FIG. 9B. If the film thickness of gate oxide film 41 increases, an interface state of the gate oxide film becomes higher, leading to a decrease in gate junction voltage strength. The decrease in gate junction voltage strength causes a degradation in electrical characteristics, resulting in a lower reliability of the semiconductor device.

SUMMARY OF THE INVENTION

One object of the present invention is to clean a surface of a semiconductor substrate.

Another object of the present invention is to remove a native oxide film formed on a surface of a semiconductor substrate.

A further object of the present invention is to remove a native oxide film formed on a surface of a silicon substrate.

A still further object of the present invention is to remove an $SiF_x$ layer formed on a surface of a silicon substrate.

A still further object of the present invention is to remove a surface damaged layer formed on a surface of a semiconductor substrate.

A still further object of the present invention is to provide a method of manufacturing a highly reliable semiconductor device including a MOSFET.

A still further object of the present invention is to provide a method of manufacturing a highly reliable semiconductor device having a contact hole.

A still further object of the present invention is to provide a method of manufacturing a highly reliable semiconductor device having a trench.

The present invention is directed to a surface treating method of a semiconductor substrate, on the surface of which an oxide film is formed. The surface of the semiconductor substrate is subjected to plasma etching by employing a gas containing fluorine in order to remove the above oxide film (step (a)). The surface of the semiconductor substrate is again subjected to plasma etching by employing the gas containing fluorine in order to remove a surface damaged layer and a fluorocarbon layer formed in the above step (a) (step (b)). The surface of the semiconductor substrate is then irradiated with ultraviolet rays under a low pressure in order to dissociate and remove fluorine atoms chemically adsorbed to the surface of the semiconductor substrate in the step (b).

Preferably, in the present invention, the irradiation with ultraviolet rays is carried out while heating the semiconductor substrate to 100°–300° C.

It is preferable that the ultraviolet ray irradiation is carried out with a reducing gas being supplied to the surface of the semiconductor substrate.

Further, it is preferable that the ultraviolet ray irradiation is carried out with reducing radicals being supplied to the surface of the semiconductor substrate.

In accordance with the present invention, since the surface of the semiconductor substrate is irradiated with ultraviolet rays under a low pressure after the step (b), the fluorine atoms chemically adsorbed to the surface of the semiconductor substrate in the step (b) are dissociated and removed.

In this case, if a reducing gas or reducing radicals are supplied to the surface of the semiconductor substrate, then the dissociated fluorine becomes efficiently removed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description of the present invention will now be made with reference to the figures.

FIGS. 1A-1F are cross-sectional views showing the steps of treating a semiconductor substrate surface according to one embodiment of the present invention. FIG. 2 is a conceptional view showing a detailed structure of a photoreaction chamber for use in the present invention.

A description will first be made on the detailed structure of the photoreaction chamber with reference to FIG. 2 before a description of the treatment steps of FIGS. 1A-1F.

A photoreaction chamber 17 includes a treatment chamber 29 for treating a surface of a semiconductor substrate 23 with light in high vacuum. Treatment chamber 29 includes therein a sample board 24 for securing the semiconductor substrate thereon. A plasma generation chamber 28 for generating plasma by microwave discharge or the like is connected to treatment chamber 29. Plasma generation chamber 28 has a gas inlet 28a for introducing a gas into plasma generation chamber 28.

Treatment chamber 29 has a gas outlet 27 for putting the interior of treatment chamber 29 in a high vacuum state. An ultraviolet light source 20 (a low-pressure mercury lamp) for emitting ultraviolet rays is disposed at a position which is outside the treatment chamber and opposing to sample board 24. Ultraviolet light source 20 is horizontally movable. Treatment chamber 29 has a window 21 through which light emitted from ultraviolet light source 20 enters in treatment chamber 29. An infrared lamp 25 serving as a light source for heating a sample is disposed on the top of treatment chamber 29. Treatment chamber 29 has a window 26 for introducing infrared rays emitted from infrared lamp 25 into treatment chamber 29.

The treatment steps according to one embodiment of the present invention will now be described.

Figure 1A:
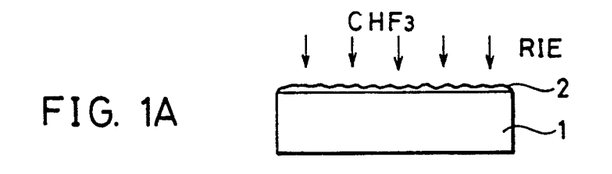
FIGS. 1A-1F are cross-sectional views showing treatment steps according to one embodiment of the present invention.
Figure 1B:
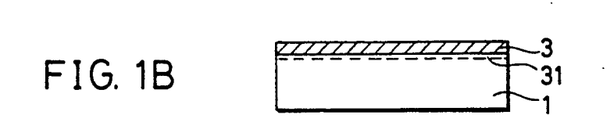
Figure 2:
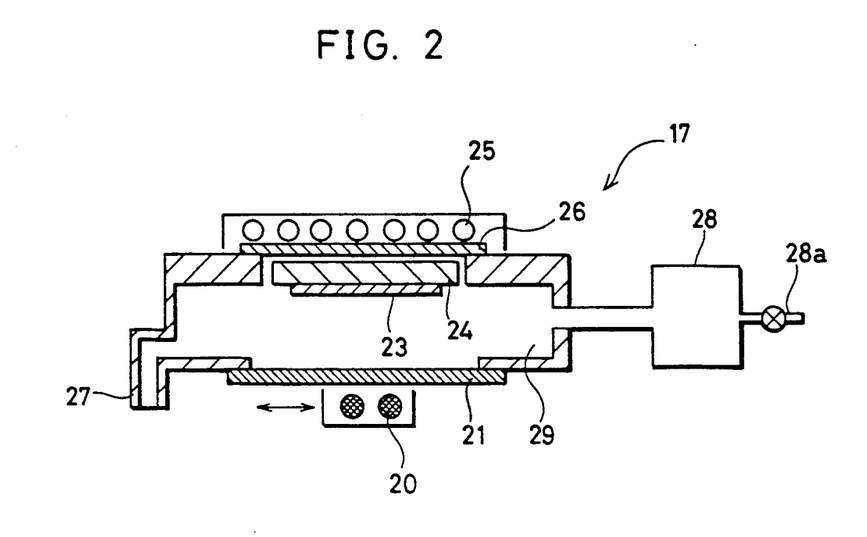
FIG. 2 is a conceptional view of a photoreaction chamber for use in a treatment of the present invention.

Referring to FIG. 1A, a native oxide film 2 formed on a surface of a silicon substrate 1 is removed by a reactive ion etching employing a $CHF_3$ gas or a mixed gas of $C_mF_n$, $H_2$ and the like. At this time, with reference to FIG. 1B, a fluorocarbon layer (a polymer layer of $CF_x$) 3 is formed on the surface of silicon substrate 1. At the same time, since the silicon surface is subjected to plasma irradiation, a surface damaged layer 31 is formed in the surface of silicon substrate 1.

Figure 1C:
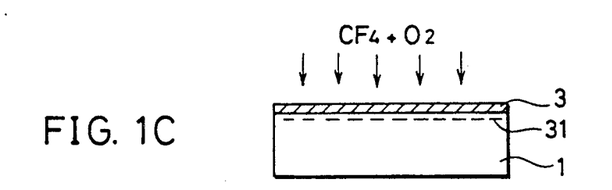
Figure 1D:
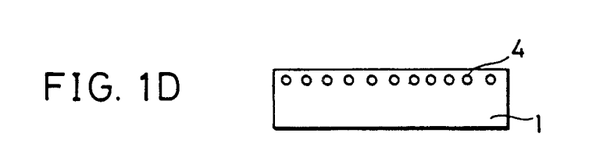

Referring to FIG. 1C, soft etching (a surface treatment by afterglow discharge) is carried out by employing a mixed gas of $CF_4$ and $O_2$ or an $NF_3$ gas in order to remove fluorocarbon layer 3 and surface damaged layer 31. At that time, with reference to FIG. 1D, fluorine is left in the form of an $SiF_x$ layer 4 in the surface of silicon substrate 1.

Figure 1E:
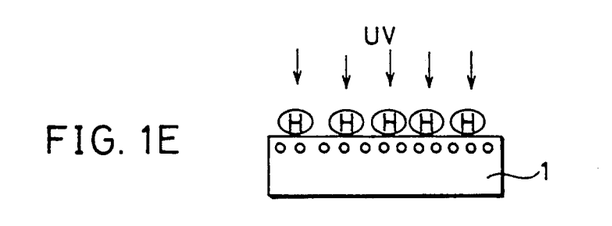

Then, with reference to FIG. 1E, a treatment with ultraviolet ray irradiation, which is a feature of the present invention, is performed.

Referring to FIG. 2, semiconductor substrate 23 subjected to a soft etching treatment is fixed to sample board 24. The atmosphere in photoreaction chamber 29 is exhausted through outlet 27 by a turbo molecular pump until the pressure in photoreaction chamber 29 becomes $1 \times 10^{-5}$ to $10^{-6}$ Torr. Infrared lamp 25 is turned on, so that infrared rays are directed to sample board 24 through 20 window 26, to heat semiconductor substrate 23 up to 250° C. A highly reducing gas such as an $H_2$ gas or an $NH_3$ gas is then introduced into plasma generation chamber 28 through gas inlet 28a at a flow rate of 200 SCCM. Hydrogen radicals are produced in this plasma generation chamber 28 by microwave afterglow discharge and then introduced into treatment chamber 29. With treatment chamber 29 kept in such an atmosphere, low-pressure mercury lamp 20 is turned on, so that ultraviolet rays of a wavelength 184.9 nm are introduced into treatment chamber 29. The irradiance of the ultraviolet rays is 100 mW/cm². A gas pressure in treatment chamber 29 was kept at 0.3 Torr. The surface treatment was carried out for ten minutes. The following reaction occurs in this treatment.

While such a case is exemplified that hydrogen radicals are introduced into treatment chamber 29 in this step, the present invention is not limited to this, and the above reducing gas may be introduced as it is into treatment chamber 29.

Figure 1F:
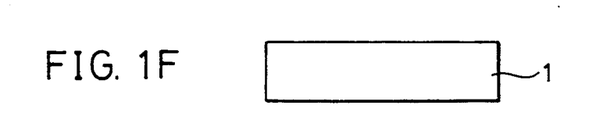

Silicon substrate 1 having a clean surface is thus obtained with reference to FIG. 1F.

For evaluation, the silicon substrate thus treated has undergone an X-ray photoemission spectroscopy analysis.

Figure 3:
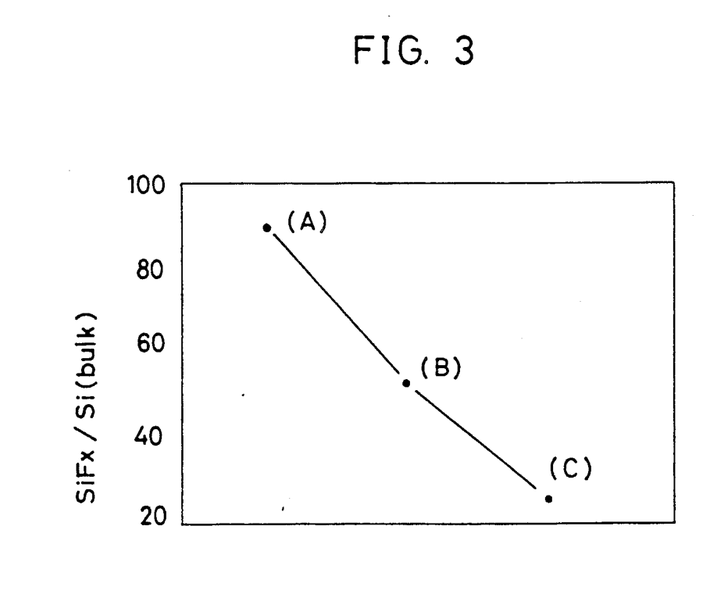
FIG. 3 is a diagram showing a result of an X-ray photoemission spectroscopy analysis of a semiconductor substrate subjected to the treatment of the present invention, along with reference data.

FIG. 3 shows the result of the X-ray photoemission spectroscopy analysis on an $Si_{2p}$ orbit, wherein the longitudinal axis represents relative values of $SiF_x$ coupling to Si (bulk) coupling. In the figure, the dot denoted with (C) represents data of the semiconductor substrate which has undergone all the steps of FIGS. 1A-1F. The dot denoted with (A) represents data of the semiconductor substrate which has undergone only the step of FIG. 1A (the reactive ion etching only); i.e., data of the semiconductor substrate shown in FIG. 1B. The dot denoted with (B) represents data of the semiconductor substrate which has undergone the steps of FIGS. 1A-1D (the reactive ion etching and the soft etching). As apparent from FIG. 3, it was confirmed that when the ultraviolet-ray treatment shown in FIG. 1E, which is the feature of the present invention, is carried out, the $SiF_x$ coupling decreases and the fluorine is efficiently removed at the surface of the silicon substrate.

While such a case is exemplified that the irradiance of ultraviolet rays is 100 mW/cm² in the foregoing embodiment, the present invention is not limited to this, and a preferable result can be obtained if the irradiance is higher than or equal to 50 mW/cm².

In addition, while such a case is exemplified that the semiconductor substrate is heated up to 250° C. in the foregoing embodiment, the present invention is not limited to this, and a preferable result can be obtained at a temperature in the range of 100° to 300° C.

Moreover, while radicals are formed by microwave afterglow discharge in the foregoing embodiment, the present invention is not limited to this, and any methods cable of forming radicals can be employed.

While the wavelength of ultraviolet rays is 184.9 nm in the foregoing embodiment, the present invention is not limited to this, and any ultraviolet rays having wavelengths of 200 nm or less than 300 nm can be employed.

In addition, while the gas pressure in the treatment chamber is kept at 0.3 Torr in the foregoing embodiment, the present invention is not limited to this, and a preferable result can be obtained at a pressure in the range of 0.3-5 Torr.

FIGS. 4A-4H show an example in which the method of surface treatment with light according to the present invention is applied to the steps of manufacturing a semiconductor device including a MOSFET of an LDD structure.

Figure 4A:
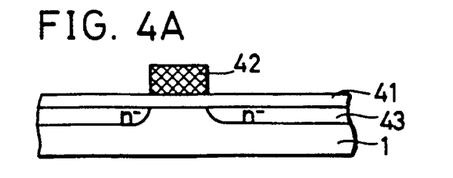
FIGS. 4A-4H show an example in which a method of surface treatment with light according to the present invention is applied to process steps for manufacturing a semiconductor device including an LDD type MOSFET.

Referring to FIG. 4A, a gate oxide film 41 is formed on a silicon substrate 1. A gate electrode 42 is formed on gate oxide film 41. With gate electrode 42 serving as a mask, n⁻ impurity ions are implanted onto a main surface of silicon substrate 1, thereby to form an n⁻ impurity layer 43 in the main surface of silicon substrate 1.

Figure 4B:
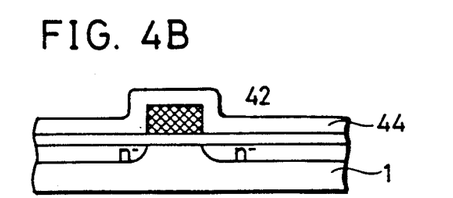

Referring to FIG. 4B, an $SiO_2$ film 44 is formed on silicon semiconductor substrate 1 to cover gate electrode 42 by a CVD method.

Figure 4C:
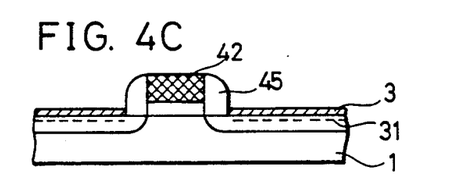

With reference to FIG. 4C, $SiO_2$ film 44 is subjected to reactive ion etching by employing a $CHF_3$ gas so that sidewall spacers 45 may be left on sidewalls of gate electrode 42. At that time, a fluorocarbon layer 3 is formed on silicon substrate 1, and a surface damaged layer 31 is formed in the main surface of silicon substrate 1.

Figure 4D:
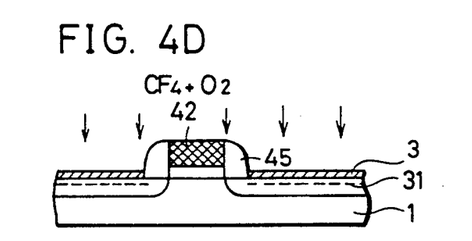

Referring to FIG. 4D, the surface of silicon substrate 1 is subjected to soft etching (a surface treatment by afterglow discharge) by employing a mixed gas of $CF_4$ and $O_2$ in order to remove fluorocarbon layer 3 and surface damaged layer 31.

Figure 4E:
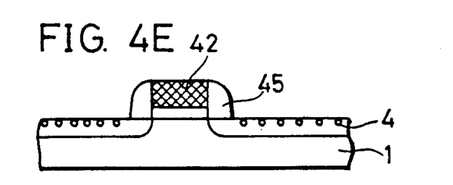

At that time, fluorine remains in the form of an $SiF_x$ layer 4 in the surface of silicon substrate 1, with reference to FIG. 4E.

Figure 4F:
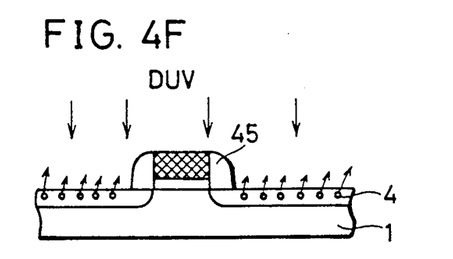

Referring to FIG. 4F, the surface of silicon substrate 1 subjected to the soft etching treatment is irradiated with ultraviolet rays under a low pressure.

Figure 4G:
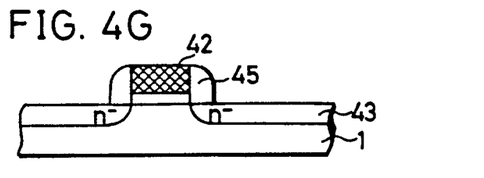

Thus, fluorine atoms chemically adsorbed to the surface of silicon substrate 1 are dissociated and removed, with reference to FIG. 4G.

Figure 4H:
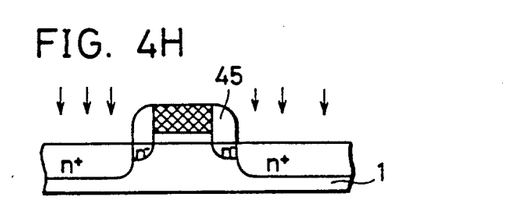

Referring to FIG. 4H, with sidewall spacers 45 serving as a mask, n⁺ impurity ions are implanted onto the main surface of silicon substrate 1. Accordingly, an MOSFET of an LDD structure is obtained. Since the $SiF_x$ layer is removed from the main surface of silicon substrate 1 by the surface treatment with light, an MOSFET having excellent semiconductor characteristics is obtained.

FIGS. 5A-5F are views showing an example in which the method of surface treatment with light according to the present invention is applied to the steps of manufacturing a semiconductor device including a contact hole.

Figure 5A:
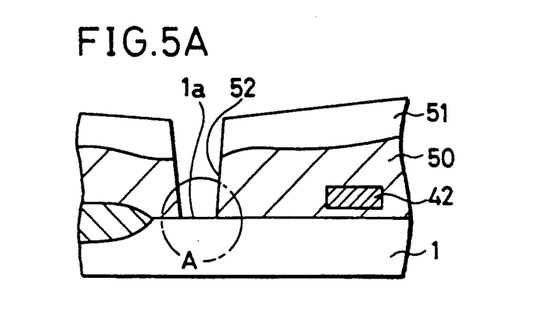
FIGS. 5A-5F show an example in which the method of surface treatment with light according to the present invention is applied to process steps for manufacturing a semiconductor device including a contact hole.

Referring to FIG. 5A, a gate electrode 42 is formed on a silicon substrate 1. An interlayer insulation film 50 is formed on silicon substrate 1 to cover gate electrode 42. A resist 51 having a predetermined pattern is formed on interlayer insulation film 50. With resist 51 serving as a mask, interlayer insulation film 50 is subjected to reactive ion etching, thereby to form a contact hole 52 for exposing a contact surface 1a of silicon substrate 1 in interlayer insulation film 50. The following steps will be described with reference to an enlarged view of the portion indicated by a reference character A in FIG. 5A.

Figure 5B:
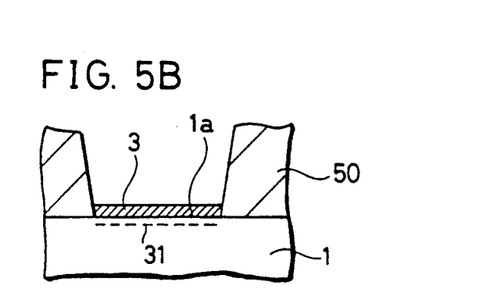

Referring to FIG. 5B, a fluorocarbon layer 3 is formed at contact surface 1a during plasma etching of interlayer insulation film 50. At that time, since the contact surface is subjected to plasma irradiation, a surface damaged layer 31 is formed in the surface of contact surface 1a.

Figure 5C:
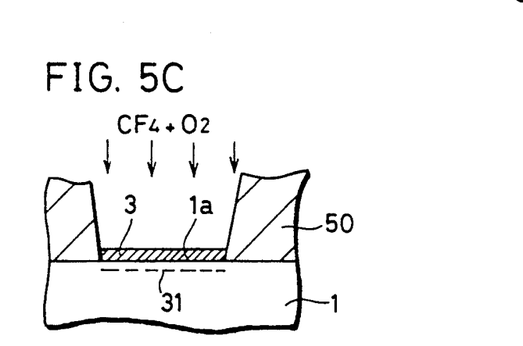
Figure 5D:
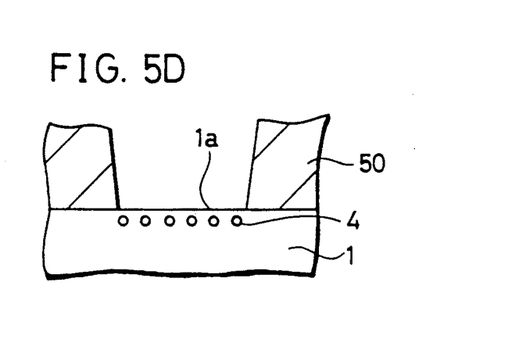

Referring to FIG. 5C, soft etching (a surface treatment by afterglow discharge) is carried out for contact surface 1a by employing a mixed gas of $CF_4$ and $O_2$ or an $NF_3$ gas in order to remove fluorocarbon layer 3 and surface damaged layer 31. At that time, with reference to FIG. 5D, fluorine remains in the form of $SiF_x$ layer 4 at the surface of contact surface 1a.

Figure 5E:
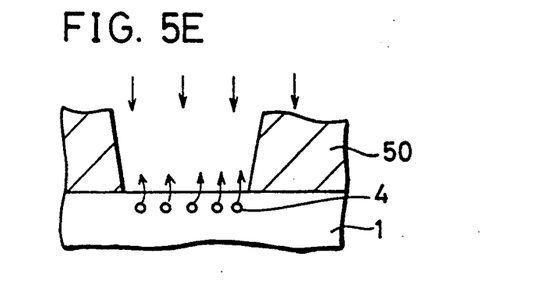
Figure 5F:
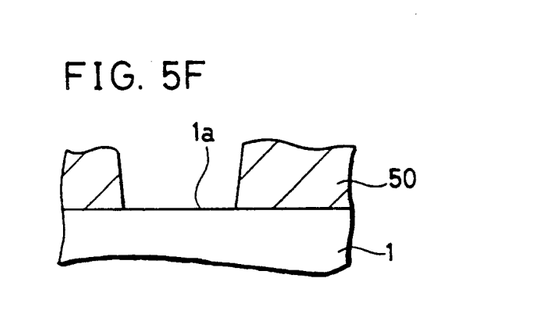

Referring to FIG. 5E, the contact surface is irradiated with ultraviolet rays under a low pressure. Accordingly, fluorine atoms chemically adsorbed to contact surface 1a are dissociated and removed. A semiconductor device having clean contact surface 1a is thus obtained with reference to FIG. 5F.

FIGS. 6A-6E are views showing an example in which the method of surface treatment with light according to the present invention is applied to the steps of manufacturing a semiconductor device having a trench.

Figure 6A:
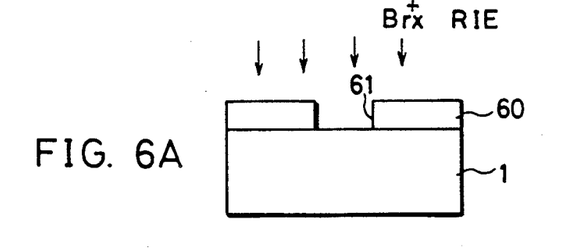
FIGS. 6A-6E show an example in which the method of surface treatment with light according to the present invention is applied to process steps for manufacturing a semiconductor device having a trench.

Referring to FIG. 6A, a silicon oxide film 60 having a predetermined opening 61 is formed on a silicon substrate 1.

Figure 6B:
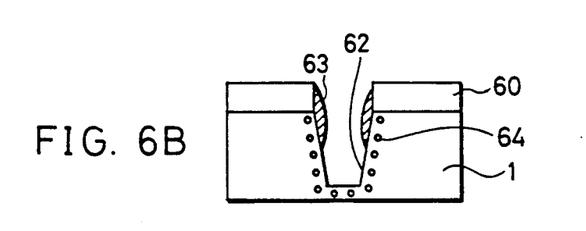

With silicon oxide film 60 serving as a mask, silicon substrate 1 is subjected to reactive ion etching by employing a gas of $HBr$, $Cl_2$ or $SF_6$, thereby forming a trench 62 in silicon substrate 1, with reference to FIG. 6B. A deposition film 63 such as of $SiB_yO_x$ or $SiClO_x$ is formed on sidewalls of trench 62. A layer 64 such as of $SiBr_x$ or $SiCl_x$ is formed at an inner wall surface of trench 62.

Figure 6C:
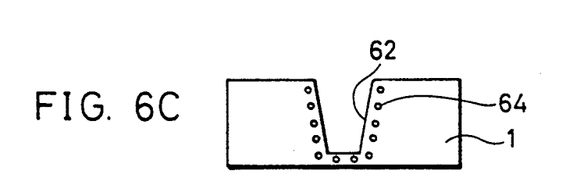

Referring to FIG. 6C, silicon oxide film 60 and deposition film 63 are removed by wet etching using HF.

Figure 6D:
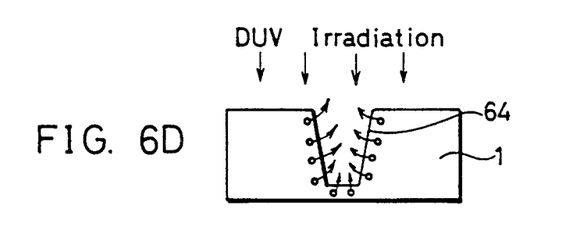

Referring to FIG. 6D, the inner wall surface of trench 62 is irradiated with ultraviolet rays under a low pressure. Thus, halogen atoms chemically adsorbed to the inner wall surface of trench 62 are dissociated and removed.

Figure 6E:
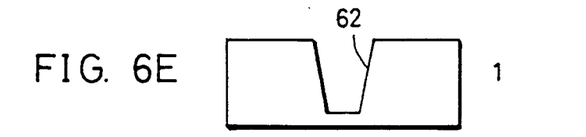

Accordingly, trench 62 having a clean surface is obtained with reference to FIG. 6E.

As has been described heretofore, in accordance with the present invention, since the surface of the semiconductor substrate is irradiated with ultraviolet rays under a low pressure after the removal of the surface damaged layer and the fluorocarbon layer formed on the surface of the semiconductor substrate, the fluorine atoms chemically adsorbed to the surface of the semiconductor substrate are dissociated and removed. Consequently, such an effect is provided that the semiconductor substrate having a clean surface is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating a surface of a semiconductor substrate on which an oxide film is formed, comprising the steps of:
   (a) plasma-etching the surface of said semiconductor substrate by employing a gas containing fluorine in order to remove said oxide film;
   (b) plasma-etching the surface of said semiconductor substrate again by employing a gas containing fluorine in order to remove a surface damaged layer and a fluorocarbon layer formed in said step (a); and
   (c) irradiating the surface of said semiconductor substrate with ultraviolet rays under a low pressure reducing gas in order to dissociate and remove fluorine atoms chemically adsorbed to the surface of said semiconductor substrate in said step (b).

2. The method of claim 1, wherein said ultraviolet ray irradiation is carried out with said semiconductor substrate being heated to 100-300° C.

3. The method of claim 1, wherein said ultraviolet ray irradiation is carried out with the surface of said semiconductor substrate being supplied with a reducing radical.

4. The method of claim 1, wherein an intensity of said ultraviolet ray irradiation is higher than or equal to 50 $mW/cm^2$.

5. The method of claim 1, wherein said reducing gas comprises hydrogen.

6. The method of claim 3, wherein said reducing radical comprises a hydrogen radical.

7. The method of claim 1, wherein said ultraviolet rays comprise an ultraviolet ray having a wavelength of less than or equal to 300 nm.

8. The method of claim 1, wherein said ultraviolet ray irradiation is carried out under a low pressure lower than or equal to 0.3-5 Torr.

9. The method of claim 1, wherein said semiconductor substrate comprises a silicon substrate.

10. A method of manufacturing a semiconductor device including a MOSFET, comprising the steps of:
    (a) forming a gate electrode on a semiconductor substrate;
    (b) forming an oxide film on said semiconductor substrate to cover said gate electrode;
    (c) plasma-etching said oxide film by employing a gas containing fluorine so as to leave a sidewall spacer on a sidewall of said gate electrode;
    (d) plasma-etching the surface of said semiconductor substrate again by employing a gas containing fluorine in order to remove a surface damaged layer and a fluorocarbon layer formed as by-products in said step (c); and
    (e) irradiating the surface of said semiconductor substrate with ultraviolet rays under a low pressure reducing gas in order to dissociate and remove fluorine atoms chemically adsorbed to the surface of said semiconductor substrate in said step (d).

11. A method of manufacturing a semiconductor device including a contact hole, comprising the steps of:
    (a) forming an interlayer insulation film on a semiconductor substrate;
    (b) selectively plasma-etching said interlayer insulation film by employing a gas containing fluorine, thereby forming a contact hole for exposing a contact surface of said semiconductor substrate in said interlayer insulation film;
    (c) plasma-etching the contact surface of said semiconductor substrate by employing a gas containing a fluorine in order to remove a surface damaged layer and a surface damaged layer and a fluorocarbon layer formed as by-products in said step (b); and
    (e) irradiating said contact surface with ultraviolet rays under a low pressure reducing gas in order to dissociate and remove fluorine atoms chemically adsorbed to said contact surface of said semiconductor substrate in said step (c).

12. A method of manufacturing a semiconductor device having a trench, comprising the steps of:
    (a) forming an oxide film having an opening on a semiconductor substrate;
    (b) plasma-etching said semiconductor substrate by employing a gas containing halogen, with said oxide film serving as a mask, thereby forming a trench in said semiconductor substrate; and
    (c) irradiating an inner wall surface of said trench with ultraviolet rays under a low pressure reducing gas in order to dissociate and remove fluorine atoms chemically adsorbed to said contact surface of said semiconductor substrate in said step (b).

* * * * *